United States Patent
Yoon et al.

(10) Patent No.: US 11,146,240 B2
(45) Date of Patent: Oct. 12, 2021

(54) MICROMECHANICAL RESONATOR AND RESONATOR SYSTEM INCLUDING THE SAME

(71) Applicant: SAMSUNG ELECTRONICS CO., LTD., Suwon-si (KR)

(72) Inventors: Yongseop Yoon, Seoul (KR); Sungchan Kang, Hwaseong-si (KR); Cheheung Kim, Yongin-si (KR); Choongho Rhee, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/880,231

(22) Filed: May 21, 2020

(65) Prior Publication Data

US 2021/0126615 A1    Apr. 29, 2021

(30) Foreign Application Priority Data

Oct. 28, 2019    (KR) .......................... 10-2019-0134796

(51) Int. Cl.
*H03H 9/24*    (2006.01)
*H03H 9/02*    (2006.01)

(52) U.S. Cl.
CPC ...... *H03H 9/2426* (2013.01); *H03H 9/02259* (2013.01)

(58) Field of Classification Search
CPC ........................................................ H03H 9/246
USPC ..................................................... 331/116 R
See application file for complete search history.

(56) References Cited

U.S. PATENT DOCUMENTS

| 10,541,670 B2 | 1/2020 | Yoon et al. | |
| 2009/0189481 A1* | 7/2009 | Kaajakari | H03H 9/2478 310/309 |
| 2018/0138886 A1 | 5/2018 | Yoon et al. | |
| 2019/0028084 A1* | 1/2019 | Yoon | G01H 1/06 |

FOREIGN PATENT DOCUMENTS

| CN | 108880328 A | 11/2018 |
| CN | 109217727 A | 1/2019 |
| KR | 10-2013-0010606 A | 1/2013 |
| KR | 10-2019-0009169 A | 1/2019 |

* cited by examiner

*Primary Examiner* — Joseph Chang
(74) *Attorney, Agent, or Firm* — Sughrue Mion, PLLC

(57) ABSTRACT

A micromechanical resonator includes a support beam having a fixed end, and a free end configured to vibrate. The micromechanical resonator includes a lumped mass disposed on the free end. A height of the lumped mass is greater than a width of the lumped mass.

20 Claims, 9 Drawing Sheets

MICROMECHANICAL RESONATOR AND RESONATOR SYSTEM INCLUDING THE SAME

CROSS-REFERENCE TO RELATED APPLICATION(S)

This application is based on and claims priority under 35 U.S.C. § 1119 to Korean Patent Application No. 10-2019-0134796, filed on Oct. 28, 2019, in the Korean Intellectual Property Office, the disclosure of which is incorporated by reference herein in its entirety.

BACKGROUND

1. Field

The present disclosure relates to a micromechanical resonator and a resonator system including the same.

2. Description of Related Art

A micromechanical resonator has a cantilever beam structure having a fixed side and a vibrating side. The micromechanical resonator may be used to analyze acoustic characteristics or vibration characteristics through the vibration of the cantilever beam structure.

Such micromechanical resonators may be used for the acoustic analysis of voice information in mobile electronic devices, automobiles, and the like. In addition, the micromechanical resonator may be attached to the human skin, or the like, to measure biometric information such as heart rate, or may be mounted on an automobile or home appliance to detect vibration information.

In addition, the micromechanical resonator may be utilized as an energy harvesting device that generates energy using sound or vibration.

SUMMARY

Provided are a micromechanical resonator and a resonator system including the same, the resonator system being capable of improving the sensitivity of a sensor.

Additional aspects will be set forth in part in the description which follows and, in part, will be apparent from the description, or may be learned by practice of the presented embodiments of the disclosure.

According to an aspect of an embodiment, a micromechanical resonator includes a support beam having a fixed end, and a free end configured to vibrate. The micromechanical resonator includes a lumped mass disposed on the free end. A height of the lumped mass is greater than a width of the lumped mass.

The height of the lumped mass is at least ten times the width of the lumped mass.

The micromechanical resonator includes a piezoelectric sensor portion, disposed on the fixed end, including a lower electrode, a piezoelectric material layer, and an upper electrode.

The height of the lumped mass is greater than or equal to one hundred micrometers.

A material of the lumped mass comprises a polymer.

A density of the lumped mass is less than or equal to two grams per cubic centimetre.

The width of the lumped mass is equal to a width of the free end.

The width of the lumped mass is greater than a width of the free end.

The micromechanical resonator includes another lumped mass disposed apart from the lumped mass in a longitudinal direction of the support beam.

A height of the lumped mass is equal to a height of the another lumped mass.

According to an aspect of the disclosure, resonator system includes a support member, and a plurality of micromechanical resonators each having an end fixed to the support member. The plurality of micromechanical resonators have different resonance frequencies. At least one of the plurality of micromechanical resonator includes a support beam having a fixed end, and a free end configured to vibrate, and a lumped mass disposed on the free end. A height of the lumped mass is greater than a width of the lumped mass.

The height of the lumped mass is at least ten times the width of the lumped mass.

The resonator system includes a piezoelectric sensor portion, disposed on the fixed end, including a lower electrode, a piezoelectric material layer, and an upper electrode.

The height of the lumped mass is greater than or equal to one hundred micrometers.

A material of the lumped mass comprises a polymer.

A density of the lumped mass is less than or equal to two grams per cubic centimetre.

The width of the lumped mass is equal to a width of the free end.

The width of the lumped mass is greater than a width of the free end.

The resonator system includes another lumped mass disposed apart from the lumped mass in a longitudinal direction of the support beam.

A height of the lumped mass is equal to a height of the another lumped mass.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
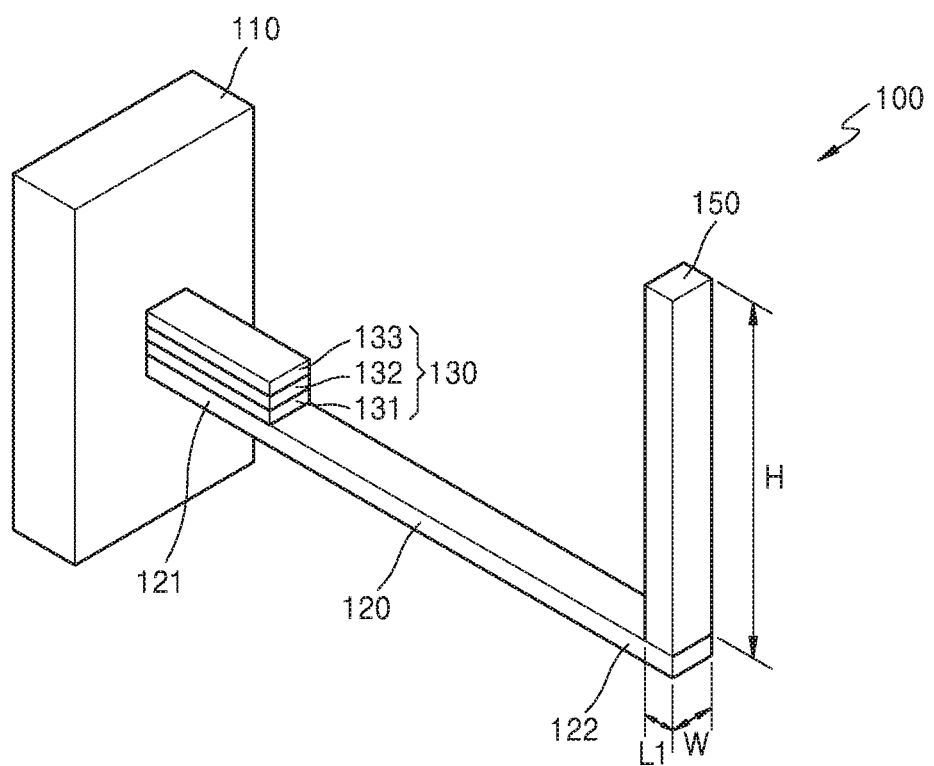
FIG. 1 is a perspective view of a structure of a micromechanical resonator according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a micromechanical resonator and a resonator system including the same according to an embodiment will be described in detail with reference to the accompanying drawings. The same reference numerals refer to the same elements throughout. In the drawings, sizes or thicknesses of constituent elements may be exaggerated for convenience of explanation. The embodiments described below are only examples, and thus, it should be understood that the embodiments may be modified in various forms.

Figure 2:
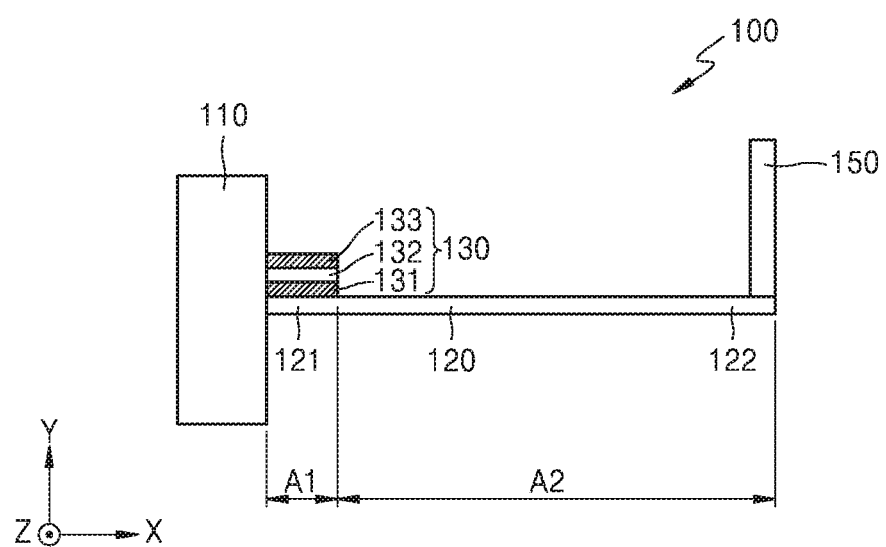
FIG. 2 is a cross-sectional view of a structure of a micromechanical resonator according to an embodiment.

FIG. 1 is a perspective view of a structure of a micromechanical resonator 100 according to an embodiment, and FIG. 2 is a cross-sectional view of a structure of the micromechanical resonator 100 according to an embodiment.

Referring to FIGS. 1 and 2, the micromechanical resonator 100 may have a cantilever structure. The micromechanical resonator 100 may include a support beam 120 having one end fixed to a support member 110 and a lumped mass 150 at the other end of the support beam 120.

The support member 110 may be a member formed on a mobile electronic device, such as a mobile phone or a car device. However, the support member 110 is not limited thereto, and may be one of various devices.

The support beam 120 may have a beam shape and may be referred to by a name such as a cantilever. The support beam 120 includes a fixed end 121 fixed to the support member 110 and a free end 122 capable of vibrating. A width W of the support beam 120 may be approximately several tens of micrometers to several hundred micrometers.

The support beam 120 may include silicon that is mainly used in a semiconductor process. However, the embodiment is not limited thereto. The support beam 120 may also be formed of glass, silicon oxide, silicon nitride, or the like.

The lumped mass 150 is on the free end 122. Depending on the lumped mass 150, a resonance frequency of the micromechanical resonator 100 may vary.

The micromechanical resonator 100 may further include a piezoelectric sensor portion 130 on the fixed end 121 of the support beam 120. However, arrangement of the piezoelectric sensor portion 130 is not limited thereto, and the piezoelectric sensor portion 130 may be on the entire support beam 120.

The piezoelectric sensor portion 130 may include a piezoelectric material layer 132, and an upper electrode 133 and a lower electrode 131 respectively disposed on upper and lower portions of the piezoelectric material layer 132.

The upper electrode 133 and the lower electrode 131 of the piezoelectric sensor portion 130 may be formed of a metal material such as molybdenum (Mo). The piezoelectric material layer 132 may be used without limitation as long as it is a piezoelectric material used in a piezoelectric sensor, and may be formed by including, for example, AlN, ZnO, SnO, PZT, ZnSnO$_3$, polyvinylidene fluoride (PVDF), poly (vinylidene fluoride-trifluoroethylene) (P (VDF-TrFE)), or PMN-PT. An insulating layer may optionally further be formed between the lower electrode 131 and the support beam 120.

The support beam 120 may be divided into a sensing area A1 in which the piezoelectric sensor portion 130 is disposed, and a non-sensing area A2 in which the piezoelectric sensor portion 130 is not disposed.

In the micromechanical resonator 100 according to the disclosure, when an external force such as, for example, vibration, sound, or pressure is applied to the support beam 120, an inertial force may occur according to the behavior of the lumped mass 150. When the resonance frequency of the micromechanical resonator 100 and a frequency of the external force coincide with each other, a resonance phenomenon may occur, and, in this case, the inertial force may increase. This inertial force generates a bending moment in the piezoelectric sensor portion 130, and the bending moment causes stress in each layer of the piezoelectric sensor portion 130. The piezoelectric material layer 132 may generate a charge having a magnitude proportional to the stress applied to the piezoelectric material layer 132, and a voltage is generated in inverse proportion to the capacitance between the upper electrode 133 and the lower electrode 131. As a result, in the micromechanical resonator 100 according to the disclosure, information associated with an external force such as vibration, sound, or pressure may be obtained by detecting and analyzing the voltage generated in the piezoelectric sensor portion 130 by the external force such as vibration, sound, or pressure from the outside of the micromechanical resonator 100.

In the micromechanical resonator 100 according to an embodiment, in order to provide improved sensing sensitivity, the lumped mass 150 may have a structure in which a height H is greater than the width W.

The lumped mass 150 has a structure in which the height H is greater than the width W, thereby increasing the bending moment of the piezoelectric sensor portion 130 induced by an external force without increasing the weight of the lumped mass 150.

Figure 3A:
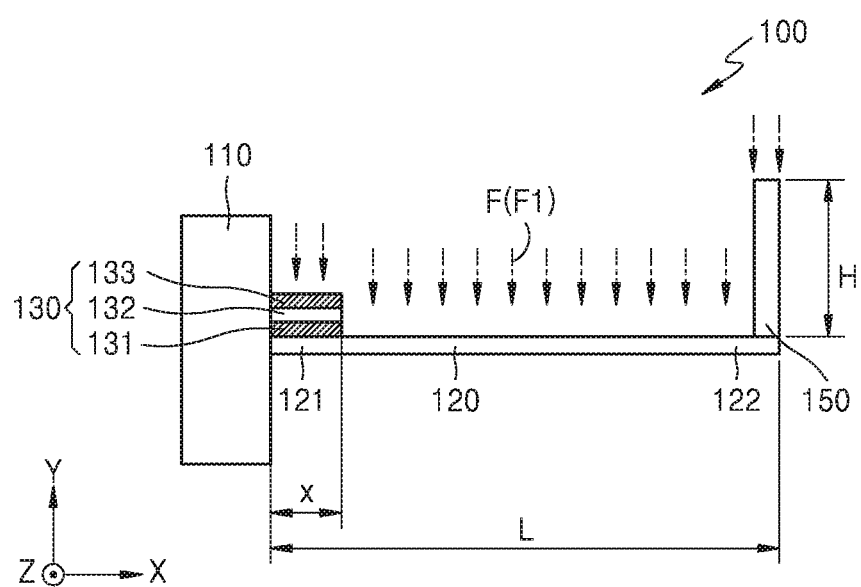
FIGS. 3A and 3B are views for explaining a bending moment of a piezoelectric sensor portion generated by an external force acting on a micromechanical resonator, according to an embodiment.
Figure 3B:
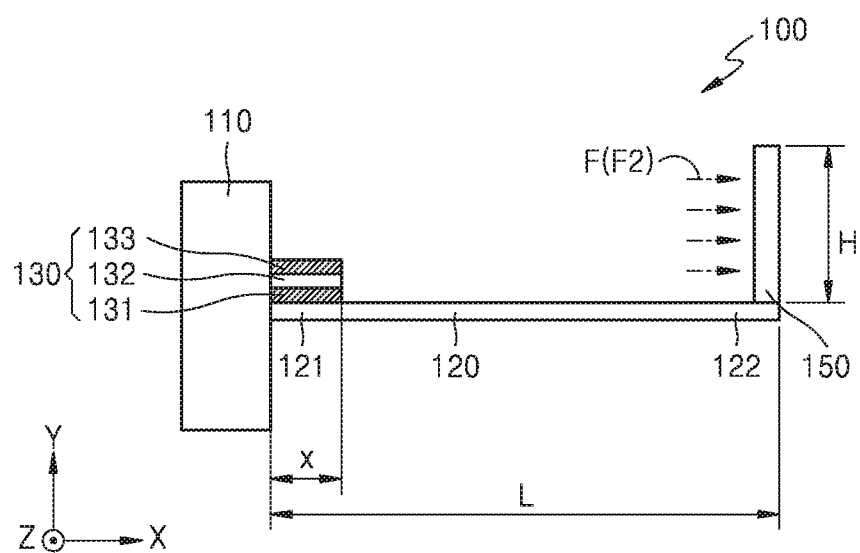
Figure 4:
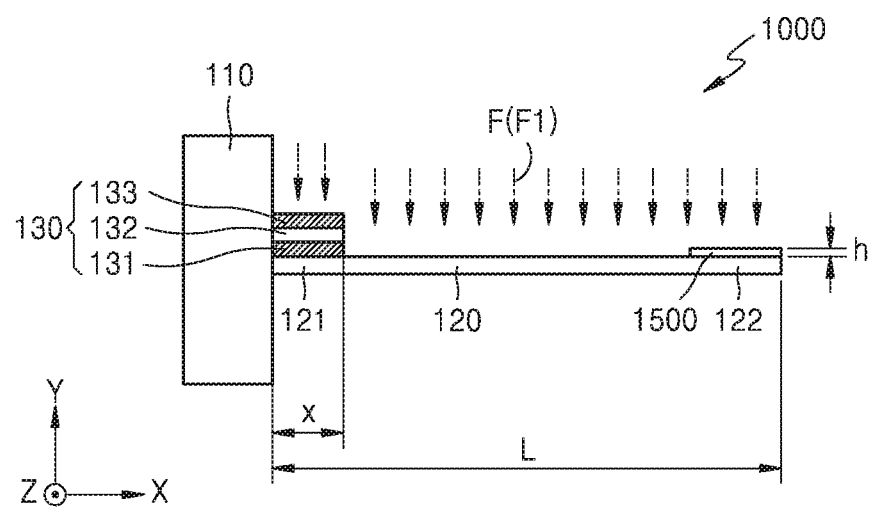
FIG. 4 is a view for explaining a bending moment of a piezoelectric sensor portion generated by an external force acting on a micromechanical resonator, according to a comparative example.

FIGS. 3A and 3B are views for explaining the bending moment of the piezoelectric sensor portion 130 generated by an external force F acting on a micromechanical resonator 100, according to an embodiment, and FIG. 4 is a view for explaining the bending moment of the piezoelectric sensor portion 130 generated by the external force F acting on a micromechanical resonator 1000, according to a comparative example. The external force F acts on the micromechanical resonator 100 as a whole. However, FIGS. 3A and 3B are shown as being divided by a direction in which the external force F acts.

Referring to FIG. 3A, in the micromechanical resonator 100 according to the embodiment, by an external force F1 acting in a direction Z perpendicular to a longitudinal direction X of the support beam 120, the support beam 120 is bent in the vertical direction Z, and thus a bending moment is generated in the piezoelectric sensor portion 130.

A bending moment M1 generated by the external force F1 acting in the direction Z perpendicular to the longitudinal direction X of the support beam 120 may be determined by Equation 1 below.

$$M1 = PW(L-x)^2/2 \qquad \text{Equation 1}$$

Referring to Equation 1, P is the magnitude of the external force, W is the width of the lumped mass 150, L is the length of the support beam 120, and x is the length of the piezoelectric sensor portion 130.

As described above, the bending moment M1 generated by the external force F1 acting in the direction Z perpendicular to the longitudinal direction X of the support beam 120 depends on the width W of the lumped mass 150 and a difference L-x between a length L of the support beam 120 and a length x of the piezoelectric sensor portion 130. In other words, unless at least one of the width W of the lumped mass 150 and the difference L-x between the length L of the support beam 120 and the length x of the piezoelectric sensor portion 130 is not changed, the bending moment M1 generated by the external force F1 acting in the direction Z perpendicular to the longitudinal direction X of the support beam 120 is not changed.

Referring to FIG. 3B, since the height H of the lumped mass 150 is relatively high in the micromechanical resonator 100 according to the embodiment, an external force F2 acting in a direction parallel to the longitudinal direction X of the support beam 120 acts on the lumped mass 150. As the external force F2 is applied to the lumped mass 150 in the direction parallel to the longitudinal direction X of the support beam 120, the support beam 120 supporting the lumped mass 150 is bent in the vertical direction Z, and thus a bending moment is generated in the piezoelectric sensor portion 130.

When the external force F2 acts in the direction parallel to the longitudinal direction X of the support beam 120, a bending moment M2 may be determined by Equation 2 below.

$$M2=PWH^2/2 \qquad \text{Equation 2}$$

Referring to equation 2, P is the magnitude of the external force, W is the width of the lumped mass 150, and H is the height of the lumped mass 150.

As described above, the bending moment M2 generated by the external force F2 acting in the direction perpendicular to the longitudinal direction X of the support beam 120 depends on the width W of the lumped mass 150 and the height H of the lumped mass 150. Accordingly, by increasing the height H of the lumped mass 150 without changing the width W of the lumped mass 150, the bending moment M2 generated by the external force F2 acting in the direction parallel to the longitudinal direction X of the support beam 120 may be increased.

The bending moment generated in the piezoelectric sensor portion 130 in the micromechanical resonator 100 according to the embodiment includes the bending moment M1 generated by the external force acting in the direction perpendicular to the longitudinal direction of the support beam 120 and the bending moment M2 generated by the external force acting in the direction parallel to the longitudinal direction of the support beam 120. Thus, the micromechanical resonator 100 may increase a bending moment generated by the external force F by increasing the height H of the lumped mass 150 without changing the width W of the lumped mass 150, the length L of the support beam 120, or the length x of the piezoelectric sensor portion 130.

Referring to FIG. 4, the micromechanical resonator 100 according to the comparative example has the lumped mass 150 having a relatively low height h. For example, the lumped mass 150 has a structure in which the height h is lower than the width W. Since the height H of the lumped mass 150 is low, the external force F2 (as shown in FIG. 3B) hardly acts on the lumped mass 150 in a direction parallel to a longitudinal direction L of the support beam 120. Accordingly, the bending moment M2 is hardly generated by the external force F2 in the direction parallel to the longitudinal direction X of the support beam 120.

In contrast, in the micromechanical resonator 100 according to the embodiment, the bending moment generated by the external force F may be increased by increasing the height H of the lumped mass 150 regardless of the length L of the support beam 120 and the length x of the piezoelectric sensor portion 130. Thereby, the sensitivity of the micromechanical resonator 100 can be improved.

Table 1 below shows different output results as the height H of the lumped mass 150 is set differently in the micromechanical resonator 100 according to the embodiment. The output results in Table 1, with reference to the embodiment of FIG. 4, are expressed as a ratio with respect to an output result that appears when the lumped mass 150 having a low height and being disposed in the micromechanical resonator 1000 according to a comparative example is 1.

The lumped mass 150 according to the current embodiment and the lumped mass 150 according to the comparative example have the same weight and the width W, and different heights, H and h, respectively, and different materials. For example, the height h of a lumped mass 1500 according to the comparative example is 2 μm, and the height H of the lumped mass 150 according to the embodiments is 300 μm, 500 μm, or 1000 μm. Gold (Au) is used as a material of the lumped mass 1500 according to the comparative example, and a polymer having a lower density than gold is used as the material of the lumped mass 150 according to embodiments.

TABLE 1

| embodiment | Height H of lumped mass 150 (μm) | Length L of support beam 120 (μm) | output of example/output of comparative example |
|---|---|---|---|
| 1 | 300 | 500 | 2.08 |
| 2 | 300 | 1000 | 1.27 |
| 3 | 300 | 1500 | 1.12 |
| 4 | 500 | 500 | 4.0 |
| 5 | 500 | 1000 | 1.75 |
| 6 | 500 | 1500 | 1.33 |
| 7 | 1000 | 500 | 13 |
| 8 | 1000 | 1000 | 4 |
| 9 | 1000 | 1500 | 2.33 |

Referring to output results of Examples 1 to 9 shown in Table 1, the outputs of the micromechanical resonator 100 according to Examples increase from 1.12 times to 13 times the outputs of the micromechanical resonator 1000 according to Comparative Examples. Accordingly, when the height H of the lumped mass 150 is increased, the micromechanical resonator 100 also has a bending moment of the piezoelectric sensor portion 130 caused by the external force F2 acting in a direction parallel to the longitudinal direction X of the support beam 120. Accordingly, when the same external force F is applied, the micromechanical resonator 100 according to the embodiments may obtain greater a bending moment than that of the micromechanical resonator 1000 according to Comparative Examples, thereby improving the sensing sensitivity.

In addition, when the support beams 120 have the same length L, the outputs of the micromechanical resonator 100 increase as the height H of the lumped mass 150 increases. When lumped masses 150 have the same height H, the outputs of the micromechanical resonator 100 increase as the lengths L of the support beam 120 become shorter.

Referring to FIGS. 1 and 2, the height H of the lumped mass 150 may be several times greater than the width W of the lumped mass 150. For example, the height H of the lumped mass 150 may be at least three times the width W of the lumped mass 150. As another example, the height H of the lumped mass 150 may be at least 10 times the width W of the lumped mass 150. As another example, the height H of the lumped mass 150 may be less than or equal to 100 times greater than the width W of the lumped mass 150.

The height H of the lumped mass 150 may be between 100 μm and 2000 μm.

The width W of the lumped mass 150 may be equal to the width of the support beam 120. The width W of the lumped mass 150 may be less than or equal to 100 μm.

A length L1 of the lumped mass 150 may be less than the width W of the lumped mass 150. The length L1 of the lumped mass 150 may be less than ½ of the width W of the lumped mass 150. The length L1 of the lumped mass 150 may be less than the height H of the lumped mass 150. The length L1 of the lumped mass 150 may be less than ⅓ of the height H of the lumped mass 150.

The lumped mass 150 may be low in density to increase the height H, without increasing the weight. For example, the density of lumped mass 150 may be 2 g/cm$^3$ or less.

For example, the lumped mass 150 may include a low density polymer. The material of the lumped mass 150 may include an epoxy resin, polymethyl methacrylate (PMMA), or polydimethylsiloxane (PDMS).

When the lumped mass 150 includes a metal material such as, for example, gold or tungsten, the height of the lumped mass 150 that may be disposed on the support beam 120 may be only a few μm. The height H of the lumped mass 150 may be less than 1/10 of the width of the lumped mass 150. That is, when the lumped mass 150 includes a metal material, it is relatively more difficult to increase the height H of the lumped mass 150 to be greater than the width of the lumped mass 150.

In contrast, when the lumped mass 150 includes a polymer, it may be relatively easier to increase the height H of the lumped mass 150.

For example, the height H of the lumped mass 150 may be increased by using a method of laminating sheets of a polymer material or by using a lithography method. Accordingly, the height H of the lumped mass 150 may be more easily formed to be greater than or equal to the width of the lumped mass 150.

Figure 5:
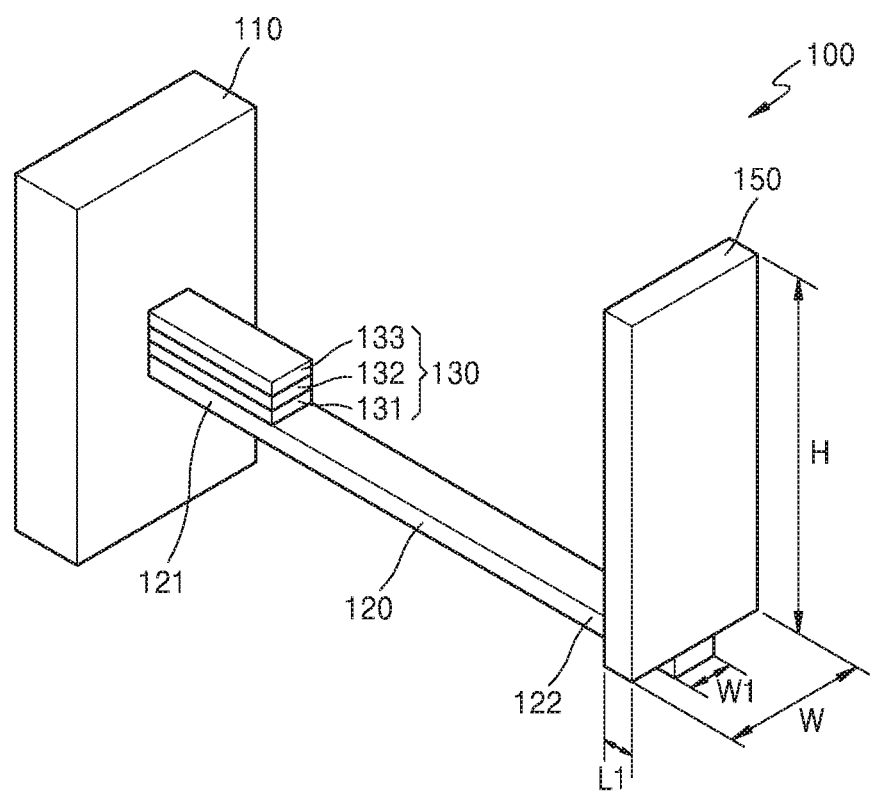
FIG. 5 is a perspective view of a structure of a micromechanical resonator, according to another embodiment.

In the above-described embodiments, the width W of the lumped mass 150 in the micromechanical resonator 100 has been described as being the same as the width of the support beam 120, but is not limited thereto. For example, as shown in FIG. 5, the width W of the lumped mass 150 may be different from a width W1 of the support beam 120. For example, the width W of the lumped mass 150 may be greater than the width W1 of the support beam 120. For example, the width W of the lumped mass 150 may be at least twice the width W1 of the support beam 120.

In addition, in the above-described embodiments, the lumped mass 150 in the micromechanical resonator 100 has been described as being singular, but the number of lumped masses 150 is not limited thereto. For example, as shown in FIGS. 6 and 7, the micromechanical resonator 100 may include the plurality of lumped masses 150 apart from each other in the longitudinal direction X of the support beam 120.

Each of the plurality of lumped masses 151, 152, and 152A may have heights H greater than widths W. The heights H of the lumped masses 151, 152, 152A may be at least three times the widths W. The heights H of the lumped masses 151, 152, and 152A may be at least 10 times the widths W of the lumped masses 151, 152, and 152A. However, the heights H of the lumped masses 151, 152, and 152A may be at least 100 times the widths W of the lumped masses 151, 152, and 152A.

Figure 6:
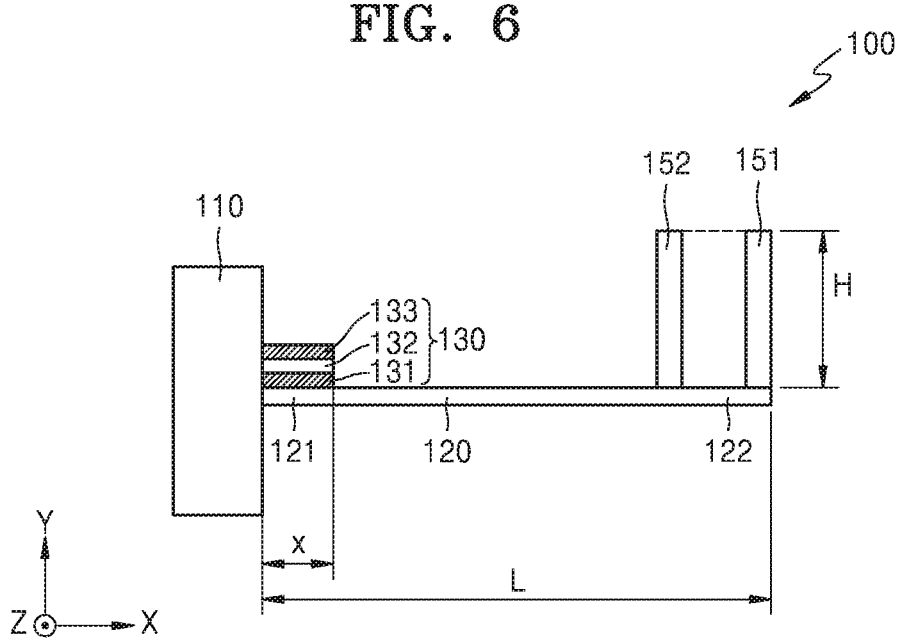
FIGS. 6 and 7 are cross-sectional views of a structure of a micromechanical resonator, according to another embodiment.
Figure 7:
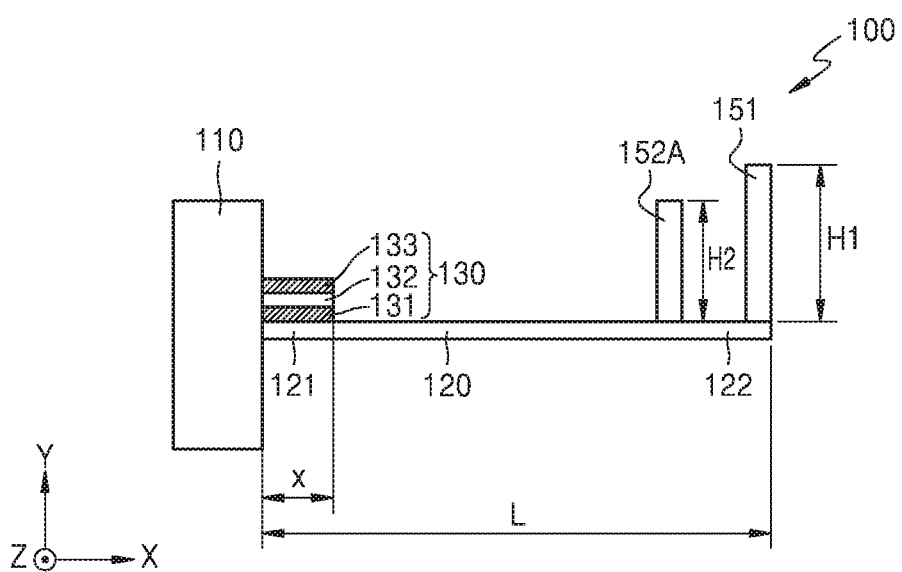

The heights H of the plurality of lumped masses 151 and 152 may be the same as in FIG. 6. As another example, as shown in FIG. 7, heights H1 and H2 of the plurality of lumped masses 151 and 152A may be different from each other.

Figure 8:
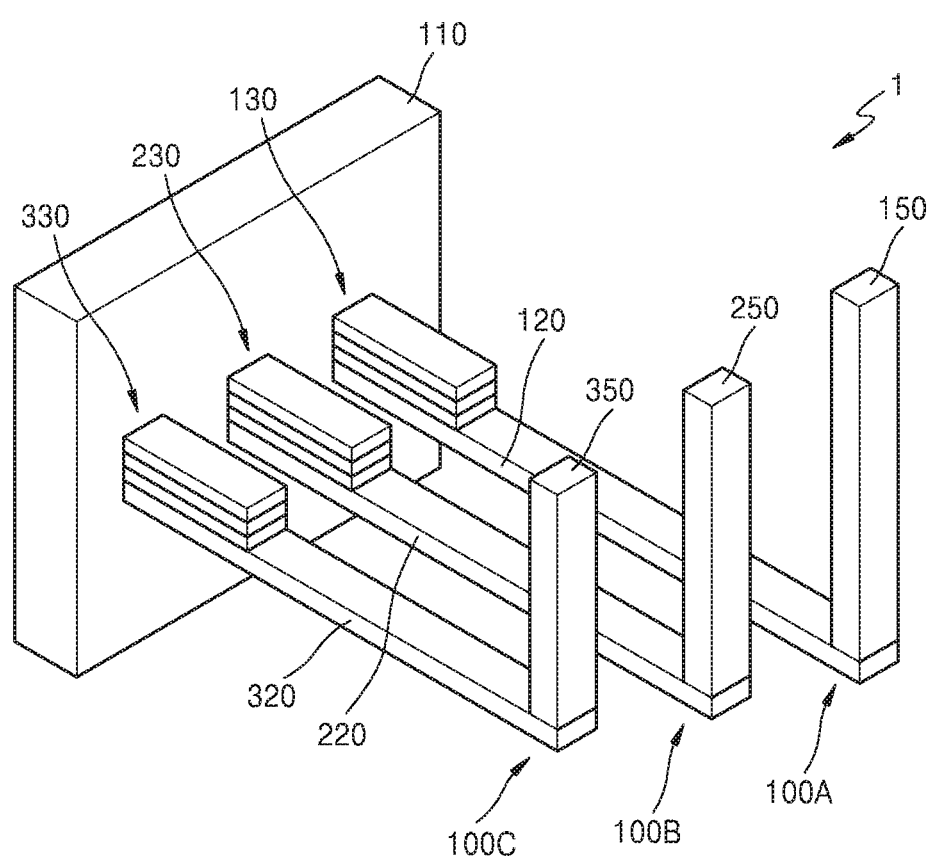
FIG. 8 is a perspective view of a resonator system according to an embodiment.

FIG. 8 is a perspective view of a resonator system 1 according to an embodiment.

Referring to FIG. 8, the resonator system 1 may include the support member 110 and a plurality of micromechanical resonators 100A, 100B, and 100C.

One end of the plurality of micromechanical resonators 100A, 100B, and 100C is fixed to the support member 110, and may have different resonance frequencies.

The plurality of micromechanical resonators 100A, 100B, and 100C include the first micromechanical resonator 100A, the second micromechanical resonator 100B that is shorter than the first micromechanical resonator 100A, and the third micromechanical resonator 100C that is shorter than the second micromechanical resonator 100B. In an embodiment, the description has been made mainly using the example of three micromechanical resonators 100A, 100B, and 100C, but the disclosure is not limited thereto, and there may be four or more micromechanical resonators.

At least one of the first, second, and third micromechanical resonators 100A, 100B, and 100C may be the micromechanical resonator 100 according to the above-described embodiments.

The first, second, and third micromechanical resonators 100A, 100B, and 100C may have support beams 120, 220, and 320, piezoelectric sensor portions 130, 230, and 330, and lumped masses 150, 250, and 350, respectively.

For example, the lumped masses 150, 250, and 350 of the first, second, and third micromechanical resonators 100A, 100B, and 100C, respectively, may have respective heights H that are greater than respective widths W. The lumped masses 150, 250, and 350 of the first, second, and third micromechanical resonators 100A, 100B, and 100C may have respective heights H greater than or equal to three times respective widths W. The lumped masses 150, 250, and 350 of the first, second, and third micromechanical resonators 100A, 100B, and 100C may have respective heights H greater than or equal to 10 times respective widths W. The respective heights H of the lumped masses 150, 250, and 350 of the first, second, and third micromechanical resonators 100A, 100B, and 100C may be greater than or equal to 100 μm.

The material of the lumped masses 150, 250, and 350 of the first, second, and third micromechanical resonators 100A, 100B, and 100C may include a polymer. The density of each of the lumped masses 150, 250, 350 of the first, second, and third micromechanical resonators 100A, 100B, 100C may be 2 g/cm$^3$ or less.

As described above, the resonator system 1 according to the embodiment includes the first, second, and third micromechanical resonators 100A, 100B, and 100C having the increased heights H of the lumped masses 150, 250, and 350, thereby improving sensing sensitivity.

The embodiments of a micromechanical resonator and a resonator system including the same have been described and illustrated in the accompanying drawings in order to facilitate understanding of the disclosure. It should be understood that embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

A micromechanical resonator and a resonator system including the same according to an embodiment may improve the sensitivity of a sensor.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A micromechanical resonator comprising:
a support beam having a fixed end, and a free end configured to vibrate; and
a lumped mass disposed on the free end,
wherein a height of the lumped mass in the first direction is greater than a width of the lumped mass in a second direction, and
wherein the second direction is perpendicular to a longitudinal direction of the support beam.

2. The micromechanical resonator of claim 1, wherein the height of the lumped mass is at least ten times the width of the lumped mass.

3. The micromechanical resonator of claim 1, further comprising a piezoelectric sensor portion, disposed on the fixed end, including a lower electrode, a piezoelectric material layer, and an upper electrode.

4. The micromechanical resonator of claim 1, wherein the height of the lumped mass is greater than or equal to one hundred micrometers.

5. The micromechanical resonator of claim 1, wherein a material of the lumped mass comprises a polymer.

6. The micromechanical resonator of claim 1, wherein a density of the lumped mass is less than or equal to two grams per cubic centimetre.

7. The micromechanical resonator of claim 1, wherein the width of the lumped mass is equal to a width of the free end.

8. The micromechanical resonator of claim 1, wherein the width of the lumped mass is greater than a width of the free end.

9. The micromechanical resonator of claim 1, further comprising:
another lumped mass disposed apart from the lumped mass in the longitudinal direction of the support beam.

10. The micromechanical resonator of claim 9, wherein a height of the lumped mass is equal to a height of the another lumped mass.

11. A resonator system comprising:
a support member; and
a plurality of micromechanical resonators each having an end fixed to the support member, the plurality of micromechanical resonators having different resonance frequencies,
wherein at least one of the plurality of micromechanical resonator includes:
a support beam having a fixed end, and a free end configured to vibrate; and
a lumped mass disposed on the free end,
wherein a height of the lumped mass is greater than a width of the lumped mass in a second direction, and
wherein the second direction is perpendicular to a longitudinal direction of the support beam.

12. The resonator system of claim 11, wherein the height of the lumped mass is at least ten times the width of the lumped mass.

13. The resonator system of claim 11, further comprising a piezoelectric sensor portion, disposed on the fixed end, including a lower electrode, a piezoelectric material layer, and an upper electrode.

14. The resonator system of claim 11, wherein the height of the lumped mass is greater than or equal to one hundred micrometers.

15. The resonator system of claim 11, wherein a material of the lumped mass comprises a polymer.

16. The resonator system of claim 11, wherein a density of the lumped mass is less than or equal to two grams per cubic centimetre.

17. The resonator system of claim 11, wherein the width of the lumped mass is equal to a width of the free end.

18. The resonator system of claim 11, wherein the width of the lumped mass is greater than a width of the free end.

19. The resonator system of claim 11, further comprising:
another lumped mass disposed apart from the lumped mass in the longitudinal direction of the support beam.

20. The resonator system of claim 19, wherein a height of the lumped mass is equal to a height of the another lumped mass.

* * * * *